(12) United States Patent
Kim et al.

(10) Patent No.: US 10,388,643 B2
(45) Date of Patent: *Aug. 20, 2019

(54) SEMICONDUCTOR DEVICE USING EMC WAFER SUPPORT SYSTEM AND FABRICATING METHOD THEREOF

(71) Applicant: Amkor Technology, Inc., Tempe, AZ (US)

(72) Inventors: Jin Young Kim, Seoul (KR); Doo Hyun Park, Seongnam-si (KR); Ju Hoon Yoon, Namyangju-si (KR); Seong Min Seo, Seoul (KR); Glenn Rinne, Apex, NC (US); Choon Heung Lee, Seoul (KR)

(73) Assignee: Amkor Technology, Inc., Tempe, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/490,091

(22) Filed: Apr. 18, 2017

(65) Prior Publication Data
US 2017/0271315 A1   Sep. 21, 2017

Related U.S. Application Data

(63) Continuation of application No. 14/083,917, filed on Nov. 19, 2013, now Pat. No. 9,627,368.

(30) Foreign Application Priority Data

Nov. 20, 2012   (KR) .................. 10-2012-0131976

(51) Int. Cl.
*H01L 25/00*   (2006.01)
*H01L 25/065*   (2006.01)
(Continued)

(52) U.S. Cl.
CPC .......... *H01L 25/50* (2013.01); *H01L 25/0657* (2013.01); *H01L 21/568* (2013.01);
(Continued)

(58) Field of Classification Search
CPC . H01L 25/50; H01L 25/0657; H01L 23/3128; H01L 21/568; H01L 25/043;
(Continued)

(56) References Cited

U.S. PATENT DOCUMENTS

| 9,627,368 B2 * | 4/2017 | Kim .................. H01L 25/50 |
| 2002/0180017 A1 | 12/2002 | Song |
| 2005/0110124 A1 | 5/2005 | Song |
| 2008/0173999 A1 | 7/2008 | Chung |
| 2011/0024888 A1 | 2/2011 | Pagaila et al. |

(Continued)

FOREIGN PATENT DOCUMENTS

| KR | 1020020091327 A | 12/2002 |
| KR | 101140113 B1 | 4/2012 |
| KR | 20080069485 A | 4/2015 |

*Primary Examiner* — Thanh Y. Tran
(74) *Attorney, Agent, or Firm* — McAndrews, Held & Malloy, Ltd.

(57) ABSTRACT

Provided are a semiconductor device using, for example, an epoxy molding compound (EMC) wafer support system and a fabricating method thereof, which can, for example, adjust a thickness of the overall package in a final stage of completing the device while shortening a fabricating process and considerably reducing the fabrication cost. An example semiconductor device may comprise a first semiconductor die that comprises a bond pad and a through silicon via (TSV) connected to the bond pad; an interposer comprising a redistribution layer connected to the bond pad or the TSV and formed on the first semiconductor die, a second semiconductor die connected to the redistribution layer of the interposer and positioned on the interposer; an encapsulation unit encapsulating the second semiconductor die, and a
(Continued)

solder ball connected to the bond pad or the TSV of the first semiconductor die.

20 Claims, 8 Drawing Sheets

(51) Int. Cl.
 *H01L 23/31* (2006.01)
 *H01L 21/56* (2006.01)

(52) U.S. Cl.
 CPC .. *H01L 23/3128* (2013.01); *H01L 2224/0401* (2013.01); *H01L 2224/05552* (2013.01); *H01L 2224/05571* (2013.01); *H01L 2224/06181* (2013.01); *H01L 2224/13022* (2013.01); *H01L 2224/1403* (2013.01); *H01L 2224/14181* (2013.01); *H01L 2224/16145* (2013.01); *H01L 2224/16147* (2013.01); *H01L 2224/16237* (2013.01); *H01L 2224/81005* (2013.01); *H01L 2225/06524* (2013.01); *H01L 2225/06572* (2013.01); *H01L 2924/00014* (2013.01); *H01L 2924/15311* (2013.01)

(58) Field of Classification Search
 CPC ... H01L 25/074; H01L 25/0756; H01L 25/117
 See application file for complete search history.

(56) References Cited

U.S. PATENT DOCUMENTS

| | | |
|---|---|---|
| 2011/0024916 A1 | 2/2011 | Marimuthu et al. |
| 2011/0031634 A1 | 2/2011 | Pagaila |
| 2011/0316147 A1 | 12/2011 | Shih et al. |
| 2012/0012990 A1 | 1/2012 | Pagaila |
| 2012/0056321 A1* | 3/2012 | Pagaila ............. H01L 23/49827 257/737 |
| 2012/0211885 A1* | 8/2012 | Choi ................... H01L 23/3128 257/737 |
| 2013/0032947 A1* | 2/2013 | Park ...................... H01L 21/568 257/774 |
| 2013/0230985 A1* | 9/2013 | Law .................. H01L 21/76898 438/667 |
| 2014/0077387 A1* | 3/2014 | Chuang ................. H01L 21/561 257/774 |
| 2014/0147970 A1 | 5/2014 | Kim |
| 2014/0242752 A1 | 8/2014 | Park et al. |

\* cited by examiner

SEMICONDUCTOR DEVICE USING EMC WAFER SUPPORT SYSTEM AND FABRICATING METHOD THEREOF

CROSS-REFERENCE TO RELATED APPLICATIONS/INCORPORATION BY REFERENCE

The present application is a CONTINUATION of U.S. patent application Ser. No. 14/083,917, filed Nov. 19, 2013, expected to issue as U.S. Pat. No. 9,627,368 on Apr. 18, 2017, and titled "SEMICONDUCTOR DEVICE USING EMC WAFER SUPPORT SYSTEM AND FABRICATING METHOD THEREOF," which makes reference to, claims priority to, and claims the benefit of Korean Patent Application No. 10-2012-0131976, filed on Nov. 20, 2012 in the Korean Intellectual Property Office and titled "SEMICONDUCTOR DEVICE USING EMC WAFER SUPPORT SYSTEM AND FABRICATING METHOD THEREOF", the entire contents of each of which are hereby incorporated herein by reference, in their entirety.

FEDERALLY SPONSORED RESEARCH OR DEVELOPMENT

[Not Applicable]

SEQUENCE LISTING

[Not Applicable]

MICROFICHE/COPYRIGHT REFERENCE

[Not Applicable]

BACKGROUND

Present systems, methods and/or architectures for forming electronic packages using support plates are inadequate. Further limitations and disadvantages of conventional and traditional approaches will become apparent to one of skill in the art, through comparison of such approaches with various aspects of the present invention as set forth in the remainder of the present application with reference to the drawings.

BRIEF DESCRIPTION OF SEVERAL VIEWS OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain principles of the present disclosure. In the drawings.

Common reference numerals are used throughout the drawings and the detailed description to indicate the same or similar elements.

DETAILED DESCRIPTION

Figure 1:
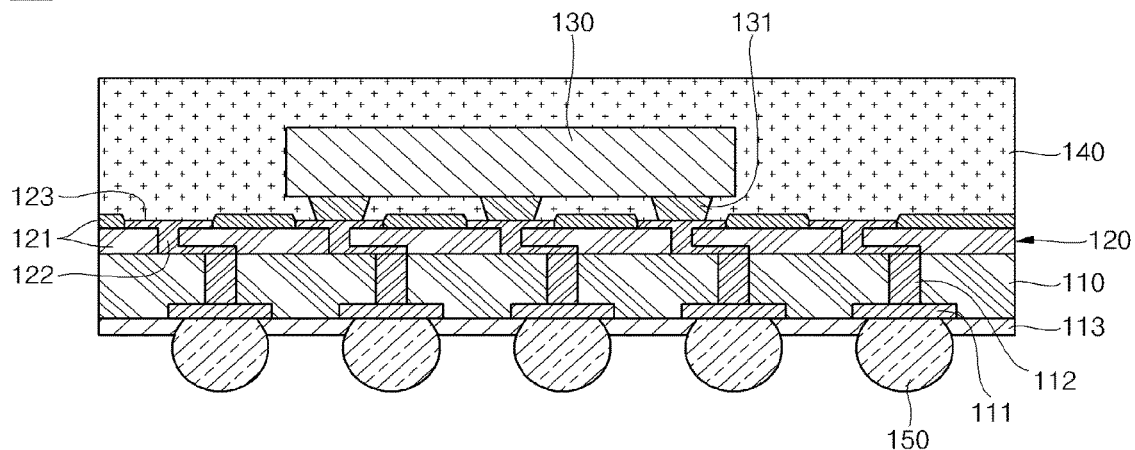
FIG. 1 is a diagram illustrating an example configuration of a semiconductor device using an EMC wafer support system according to various aspects of the present disclosure.
Figure 2A:
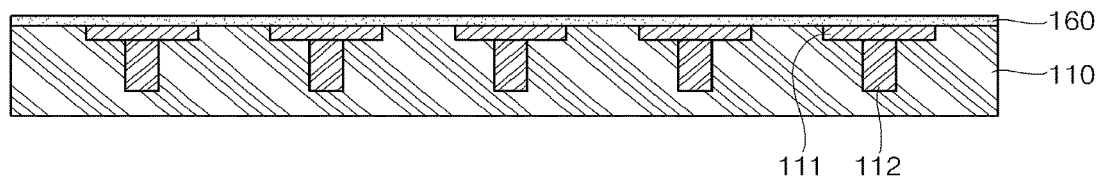
FIGS. 2a to 2j are diagrams sequentially illustrating an example fabricating method of the semiconductor device shown in FIG. 1 using an EMC wafer support system, in accordance with various aspects of the present disclosure.
Figure 2B:
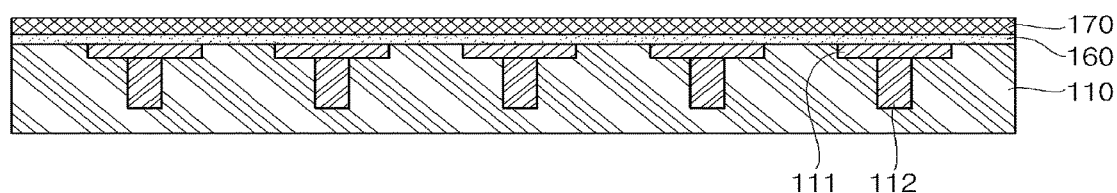
Figure 2C:
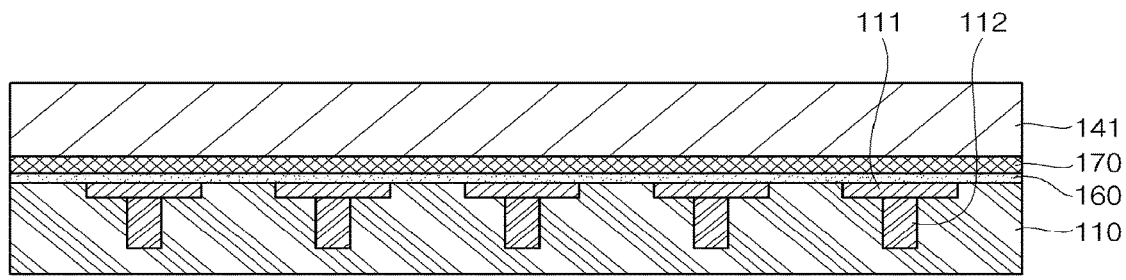
Figure 2D:
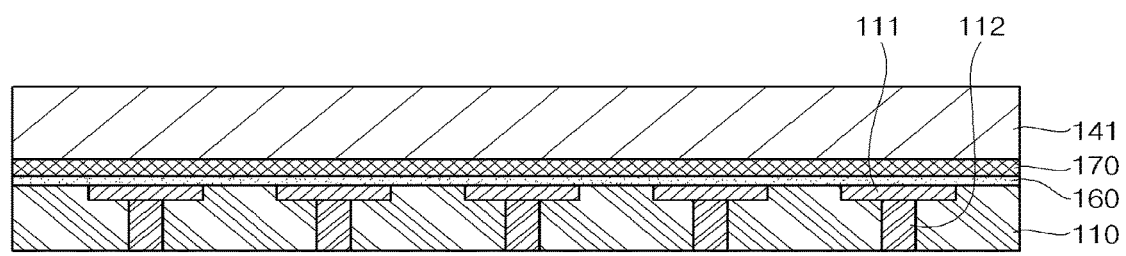
Figure 2E:
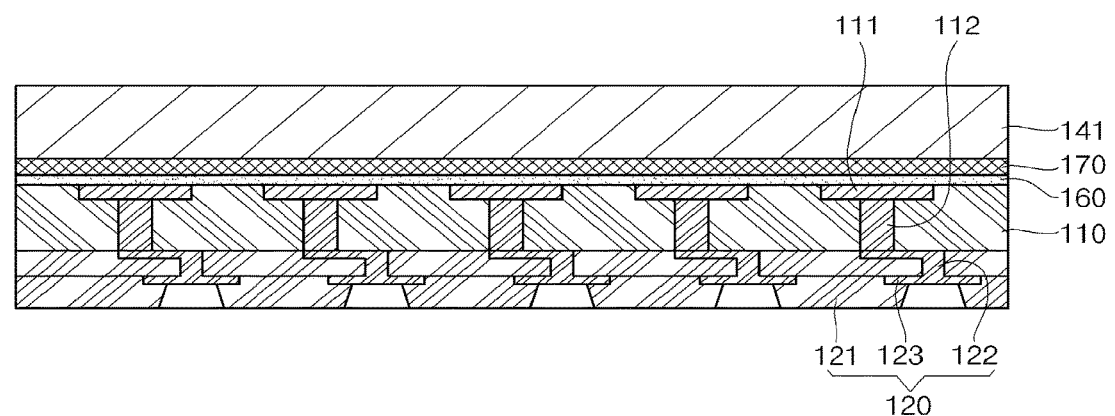
Figure 2F:
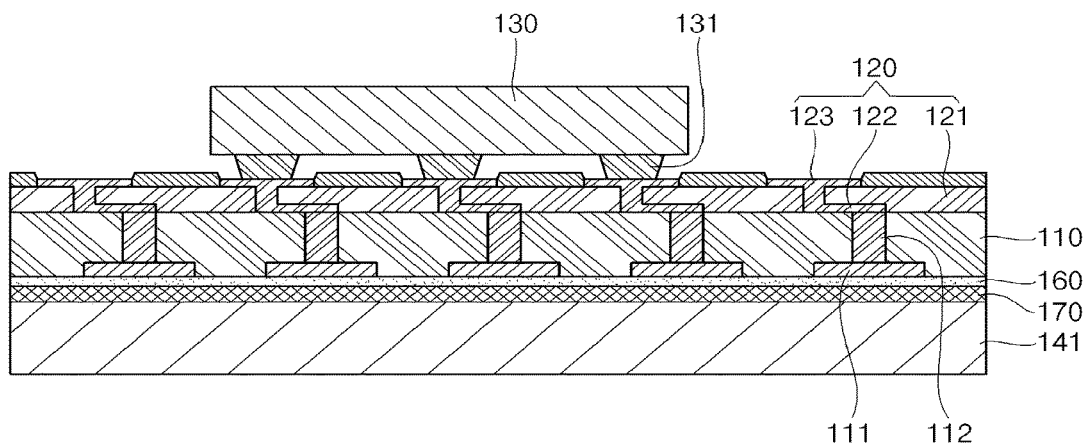
Figure 2G:
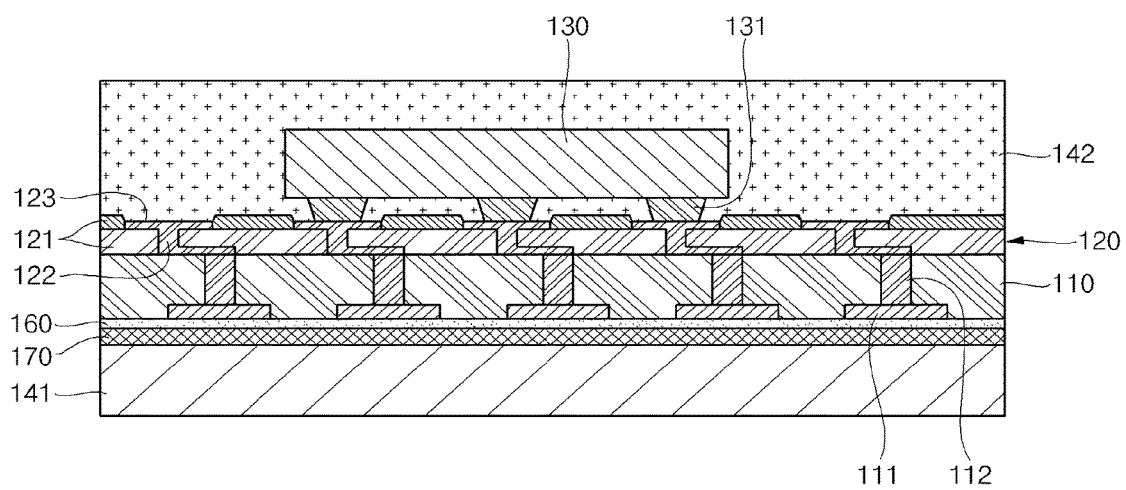
Figure 2H:
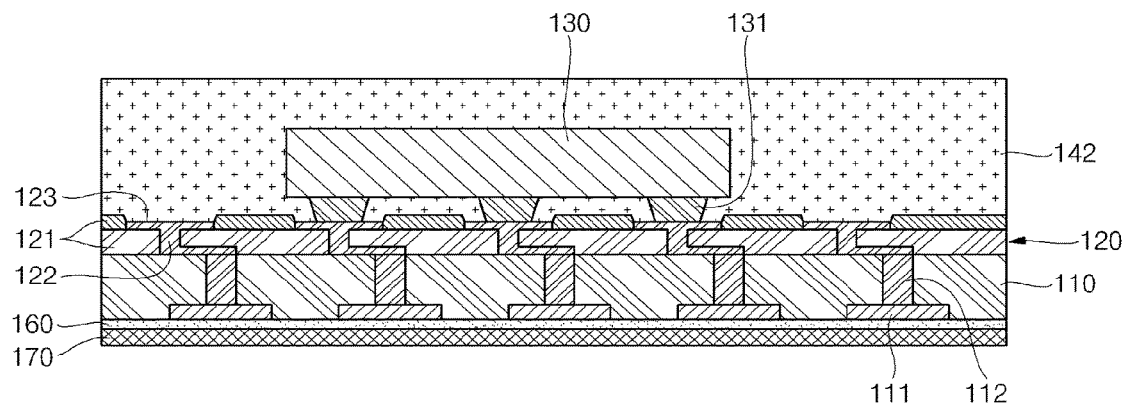
Figure 2I:
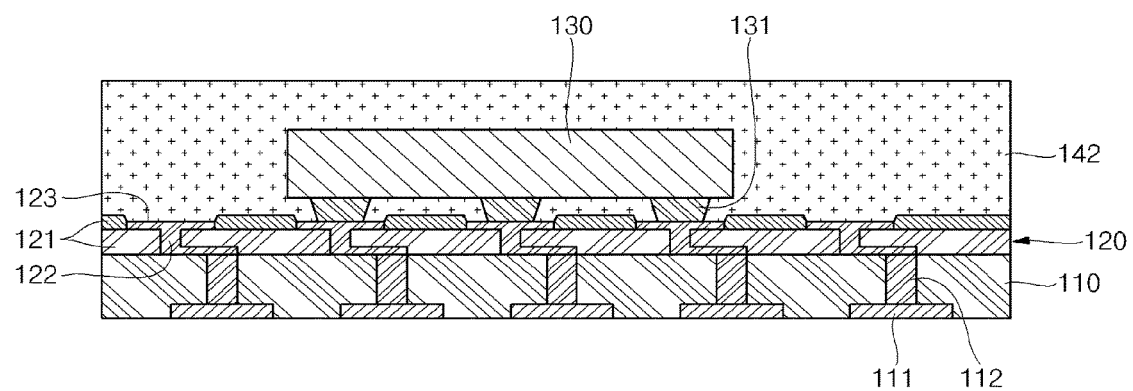
Figure 2J:
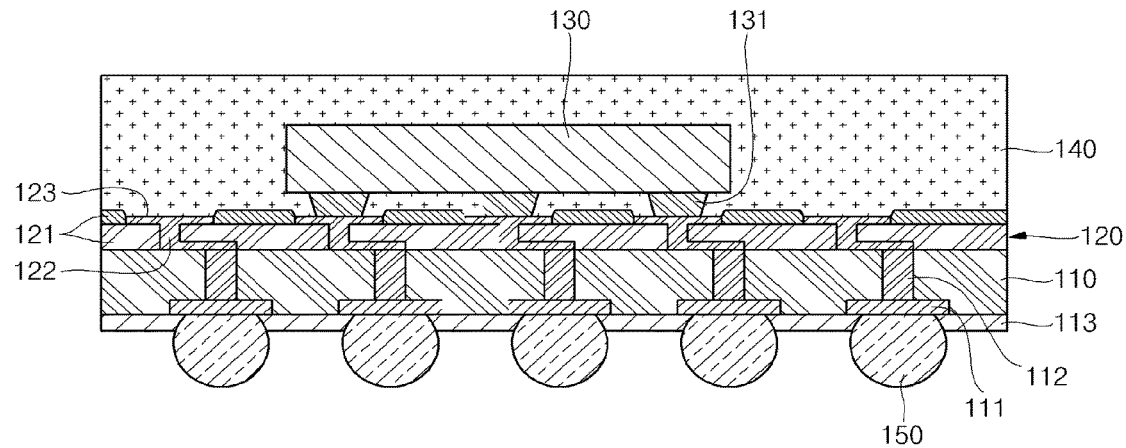

Various aspects of the present disclosure relate to a semiconductor device, for example using an epoxy molding compound (EMC) wafer support system and a fabricating method thereof.

In general, a support system for a semiconductor wafer may comprise a plate spaced apart from the wafer and having a support surface for supporting the wafer and a recessed surface spaced apart from the support surface.

In the general support system, the plate may, for example, be made of silicon carbide, silicon nitride, silicon or glass, which is costly and the utilization thereof requires many process steps.

Various aspects of the present disclosure provide a semiconductor device using an epoxy molding compound (EMC) wafer support system and a fabricating method thereof, which can adjust a thickness of the overall package in a final stage of completing the device while shortening a fabrication process and considerably reduce the fabrication cost by connecting an interposer and a semiconductor die using an epoxy molding compound (EMC), instead of a wafer support system (WSS), and executing batch processing of molding.

According to various aspects of the present disclosure, there is provided a semiconductor device including a first semiconductor die comprising a bond pad and a through silicon via (TSV) connected to the bond pad; an interposer having a redistribution layer connected to the bond pad or the TSV and formed on the first semiconductor die, a second semiconductor die connected to the redistribution layer of the interposer and positioned on the interposer; an encapsulation unit encapsulating the second semiconductor die, and a solder ball connected to the bond pad or the TSV of the first semiconductor die.

The bond pad may, for example, be formed on a bottom surface of the TSV.

The bond pad may, for example, be formed on a top surface of the TSV.

The first semiconductor die, the interposer, and lateral surfaces of the encapsulation unit may, for example, be coplanar.

A passivation layer may, for example, be formed on the bottom surface of the first semiconductor die toward the outside of the solder ball.

The redistribution layer of the interposer may, for example, be surrounded by (for example, laterally surrounded and/or at least partially vertically surrounded by) the passivation layer.

A bump may, for example, be positioned between the second semiconductor die and the interposer.

The TSV may, for example, have a length in a range of 20 to 70 μm.

The first semiconductor die may have a thickness in a range of 400 to 500 μm.

According to various aspects of the present disclosure, there is provided a fabricating method of a semiconductor device, comprising sequentially forming a seed layer and a copper layer on a top surface of a first semiconductor die including a bond pad and a through silicon via (TSV), forming a first encapsulation unit on the copper layer, the first encapsulation unit having the same size (for example, the same lateral surface area) as the first semiconductor die, exposing the TSV by performing chemical mechanical polishing (CMP) on a bottom surface of the first semiconductor die, forming an interposer having a redistribution layer connected to the TSV, connecting a second semiconductor die to the redistribution layer of the interposer, forming a second encapsulation unit encapsulating the second semiconductor die, exposing a copper layer by grinding the first encapsulation unit, sequentially etching the copper layer and the seed layer, and bonding a solder ball to the bond pad.

The first semiconductor die, the interposer, and lateral surfaces of the encapsulation unit may, for example, be coplanar.

A passivation layer may, for example, be formed on the bottom surface of the first semiconductor die toward the outside of the solder ball.

The redistribution layer of the interposer may, for example, be surrounded by (for example, laterally and/or at least partially vertically surrounded by) the passivation layer.

A bump may be positioned between the second semiconductor die and the interposer.

According to various aspects of the present disclosure, there is provided a fabricating method of a semiconductor device, including forming a first encapsulation unit on a bottom surface of a first semiconductor die including a bond pad and a through silicon via (TSV), forming an interposer on a top surface of the first semiconductor die, the interposer having a redistribution layer connected to the TSV, connecting a second semiconductor die connected to the redistribution layer of the interposer, forming a second encapsulation unit encapsulating the second semiconductor die, exposing the TSV by grinding the first encapsulation unit by chemical mechanical polishing, and bonding a solder ball to the TSV.

The first semiconductor die, the interposer, and lateral surfaces of the encapsulation unit may, for example, be coplanar.

A passivation layer may, for example, be formed on the bottom surface of the first semiconductor die toward the outside of the solder ball.

The redistribution layer of the interposer may, for example, be surrounded by (e.g., laterally and/or at least partially vertically surrounded by) the passivation layer.

A bump may, for example, be positioned between the second semiconductor die and the interposer.

As described above, in the semiconductor device using an epoxy molding compound (EMC) wafer support system and the fabricating method thereof according to various aspects of the present disclosure, a thickness of the overall package can be adjusted in a final stage of completing the device while shortening a fabrication process and considerably reducing the fabrication cost by connecting an interposer and a semiconductor die using an epoxy molding compound (EMC).

Various aspects of the present invention will be more apparent from the following detailed description taken in conjunction with the accompanying drawings. Hereinafter, semiconductor devices 100 and 200 using an EMC wafer support system according to various aspects of the present disclosure will be described with reference to the accompanying drawings.

FIG. 1 is a diagram illustrating an example configuration of a semiconductor device (100) using an EMC wafer support system according to various aspects of the present disclosure, and FIGS. 2a to 2j are diagrams sequentially illustrating an example fabricating method of the semiconductor device (100) shown in FIG. 1, for example using the EMC wafer support system in accordance with various aspects of the present disclosure.

As illustrated in FIG. 1, the semiconductor device 100 using the EMC wafer support system comprises a first semiconductor die 110, an interposer 120, a second semiconductor die 130, an encapsulation unit 140 and a solder ball 150.

The first semiconductor die 110 comprises a bond pad 111, a through silicon via (TSV) 112 connected to the bond pad 111, and a passivation layer 113. The bond pad 111 is formed on a bottom surface of the TSV 112. The TSV 112 may, for example, pass through (or through to) the bond pad 111 of the first semiconductor die 110 and may be electrically connected to the bond pad 111. The TSV 112 may, for example, have a length in a range of 20 to 70 μm, and the first semiconductor die 110 may have a length in a range of 400 to 500 μm. The passivation layer 113 may, for example, be made of a polymer.

The interposer 120 is formed on a top surface of the first semiconductor die 110 and may comprise a passivation layer 121, a redistribution layer 122, and a land 123. The redistribution layer 122 may be connected to a TSV (e.g., TSV 112) and may be surrounded by (e.g., laterally and/or at least partially vertically surrounded) the passivation layer 121. The land 123 may be formed on the redistribution layer 122 and may, for example, be surrounded by (e.g., laterally and/or at least partially vertically surrounded by) the passivation layer 121. The passivation layer 121 may be a silicon oxide layer, a silicon nitride layer or a polymer layer.

The second semiconductor die 130 is positioned on a top surface of the interposer 120 and may be connected (e.g., via one or more lands 123) to the redistribution layer 122 of the interposer 120.

The encapsulation unit 140 may, for example, be made of an epoxy molding compound (EMC), encapsulates the second semiconductor die 130 and the top surface of the interposer 120 and fills a portion between the second semiconductor die 130 and the interposer 120, thereby protecting the second semiconductor die 130 and the interposer 120 from external surroundings. The first semiconductor die 110, the interposer 120, and lateral surfaces of the encapsulation unit 140 may be coplanar.

The solder ball 150 may be connected to the bond pad 111 of the first semiconductor die 110 and may be electrically connected to the first semiconductor die 110 through the bond pad 111. In addition, the passivation layer 113 may be formed on a bottom surface of the first semiconductor die 110 toward the outside of the solder ball 150.

With the configuration of the semiconductor device 100 using the EMC wafer support system according to various aspects of the present disclosure, a semiconductor package can be adjusted to have a reduced thickness.

An example fabricating method of the semiconductor device 100 using the EMC wafer support system according to various aspects of the present disclosure may, for example, comprise: forming a seed layer and a copper layer; forming a first encapsulation unit; exposing a TSV; forming an interposer; connecting a second semiconductor die; forming a second encapsulation unit; exposing the copper layer; etching; and bonding a solder ball.

In the forming of the seed layer and the copper layer, a seed layer 160 and a copper layer 170 may be sequentially formed on the top surface of the first semiconductor die 110 including the bond pad 111 and the TSV 112. The seed layer 160 may be formed by sputtering, and may be electrically connected to the TSV 112 through the bond pad 111 formed on the top surface of the TSV 112. See, e.g., FIGS. 2a and 2b. In addition, the seed layer 160 may be made of at least one selected from the group consisting of titanium, tungsten, gold, silver, copper, and equivalents thereof, but various aspects of the present disclosure are not necessarily limited thereto. The copper layer 170 formed on the top surface of the seed layer 160 may, for example, have a thickness of approximately 30 μm. A processing variability of chemical mechanical polishing (CMP) to be performed in a subsequent step may, for example, be approximately 15 μm.

In the forming of the first encapsulation unit, a first encapsulation unit 141, for example having the same size (e.g., a same surface area) as the first semiconductor die 110 may be formed on the copper layer 170, thereby protecting the first semiconductor die 110 from external surroundings and facilitating handling of the first semiconductor die 110. See, e.g., FIG. 2c. The same surface area may, for example, be accomplished through molding, cutting, etc.

In the exposing of the TSV, the bottom surface of the first semiconductor die 110 may, for example, polished by CMP using the first encapsulation unit 141, thereby exposing the TSV 112. See, e.g., FIG. 2d. Other known methods different from CMP may also be utilized. Since the first semiconductor die 110 may be handled using the first encapsulation unit 141, it is possible to protect the first semiconductor die 110 from external surroundings.

In the forming of the interposer, the interposer 120, for example comprising the redistribution layer 122 connected to the TSV 112, may be formed. See, e.g., FIG. 2e. The second semiconductor die 130 is stacked on the first semiconductor die 110 and is electrically connected to the first semiconductor die 110 by the interposer 120. That is to say, the interposer 120 is configured such that the passivation layer 121 is formed on the bottom surface of the first semiconductor die 110 and the redistribution layer 122 is formed on the passivation layer 121 to be connected to the TSV(s) 112. The land 123 is formed on a top surface of the redistribution layer 122 and is surrounded by (e.g., laterally and/or at least partially vertically surrounded) the passivation layer 121.

In the connecting of the second semiconductor die, the second semiconductor die 130 may, for example, be connected to the redistribution layer 122 of the interposer 120. See, e.g., FIG. 2f. Without a separate packaging structure, the second semiconductor die 130 is electrically connected to the TSV 112 of the first semiconductor die 110 through the interposer 120, thereby shortening a wiring distance, compared to a method of connecting the second semiconductor die 130 through bonding. Therefore, the area and height of the semiconductor package can be reduced, and the semiconductor device 100 can be miniaturized.

In the forming of the second encapsulation unit, the second semiconductor die 130 may, for example, be encapsulated by a second encapsulation unit 142. See, e.g., FIG. 2g. The second encapsulation unit 142 may, for example, have a thickness greater than that of the first encapsulation unit 141. The second encapsulation unit 142 can facilitate handling of the first semiconductor die 110 and the second semiconductor die 130 and can protect the first semiconductor die 110 and the second semiconductor die 130 from external surroundings, for example in polishing the first encapsulation unit 141 by CMP.

In the exposing of the copper layer, the first encapsulation unit 141 may, for example, be polished by CMP using the second encapsulation unit 142, thereby exposing the copper layer 170. See, e.g., FIG. 2h. Since the processing error of CMP is approximately 15 μm, the copper layer 170 may be partially polished.

Here, the second encapsulation unit 142 is substantially the same as the encapsulation unit 140 shown in FIG. 1.

In the etching, the copper layer 170 and the seed layer 160 may be sequentially etched by CMP for removal, thereby exposing the bond pad 111 of the first semiconductor die 110. See, e.g., FIG. 2i.

In the bonding of the solder ball, the solder ball 150 may be bonded to transmit an electrical signal to the bond pad 111. See, e.g., FIG. 2j. The solder ball 150 may be made of Pb/Sn or Sn—Ag. Note that the solder ball 150 may also be another interconnection structure, for example a conductive bump, copper pillar, etc. Then, the passivation layer 113 may, for example, be formed on the bottom surface of the first semiconductor die 110 toward the outside of (e.g., laterally around) the solder ball 150.

In the fabricating method of the semiconductor device 100 using the EMC wafer support system according to various aspects of the present disclosure, forming of interposer, connecting of semiconductor die, and molding are concurrently performed through batch processing, rather than using a wafer support system made of silicon or glass, which is costly, thereby shortening the fabricating process and remarkably reducing the fabrication cost.

Figure 3:
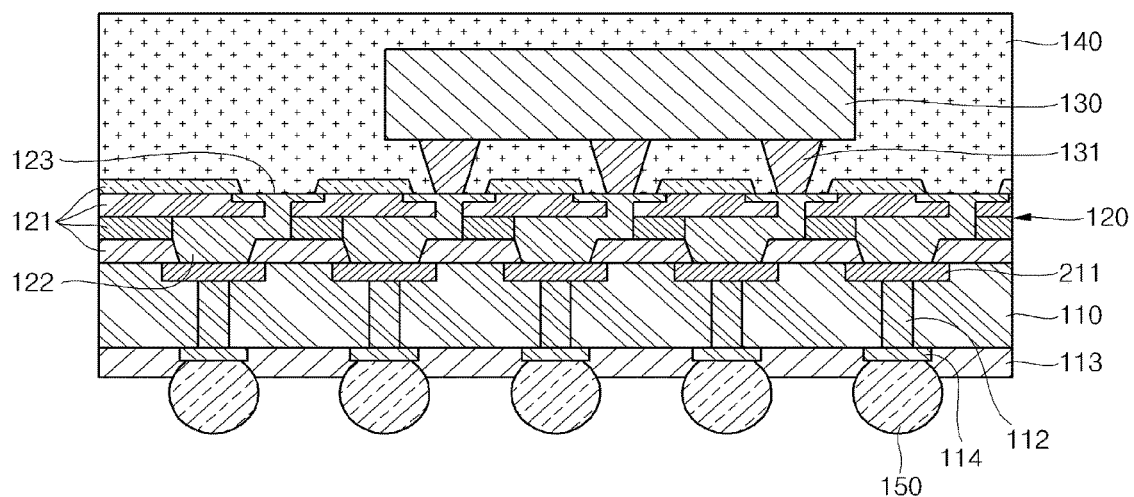
FIG. 3 is a diagram illustrating an example configuration of a semiconductor device using an EMC wafer support system according to various aspects of the present disclosure.
Figure 4A:
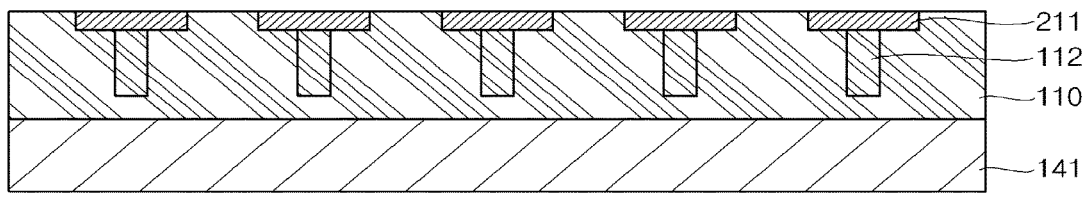
FIGS. 4a to 4g are diagrams sequentially illustrating a fabricating method of the semiconductor device shown in FIG. 3 using an EMC wafer support system in accordance with various aspects of the present disclosure.
Figure 4B:
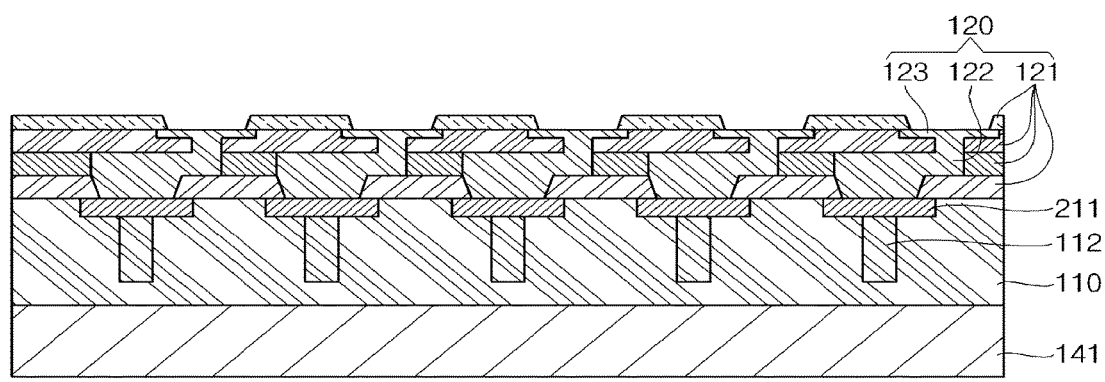
Figure 4C:
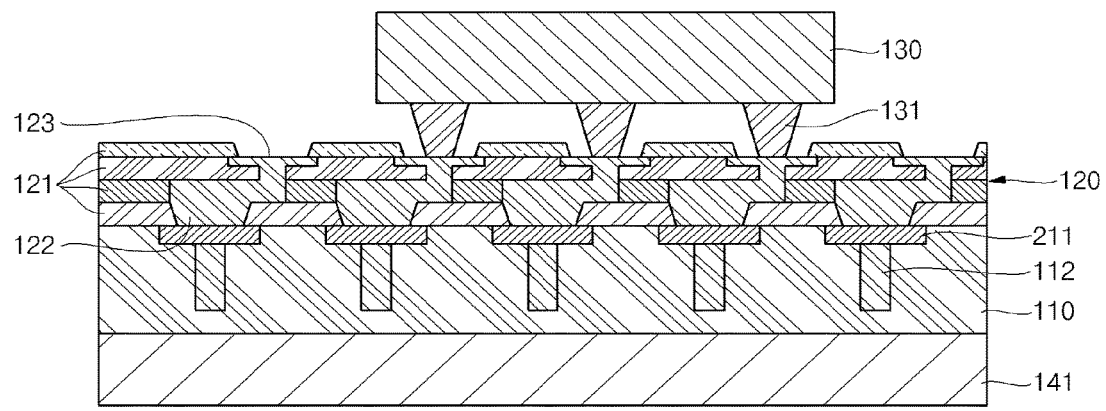
Figure 4D:
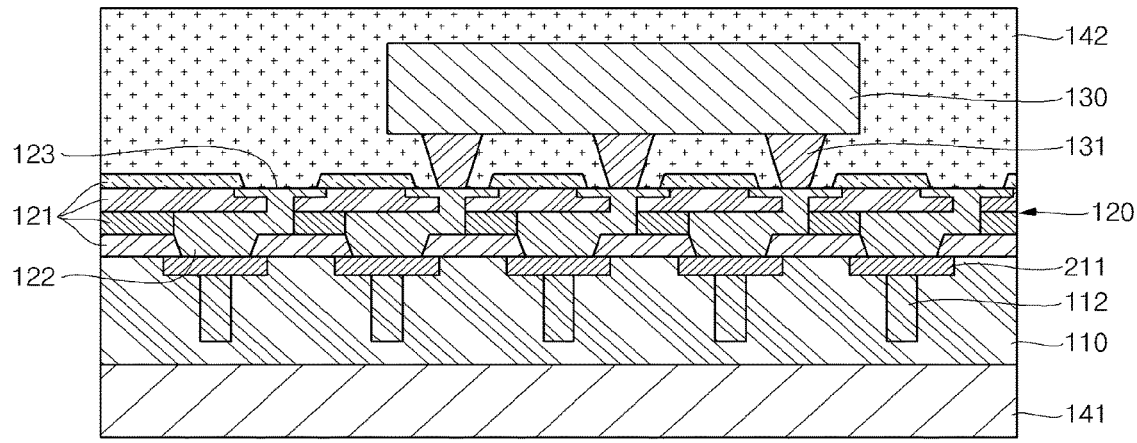
Figure 4E:
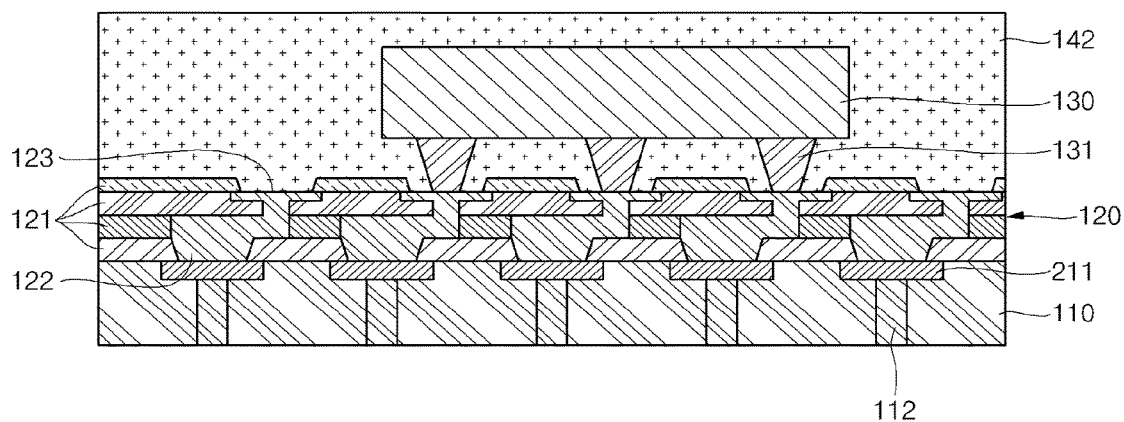
Figure 4F:
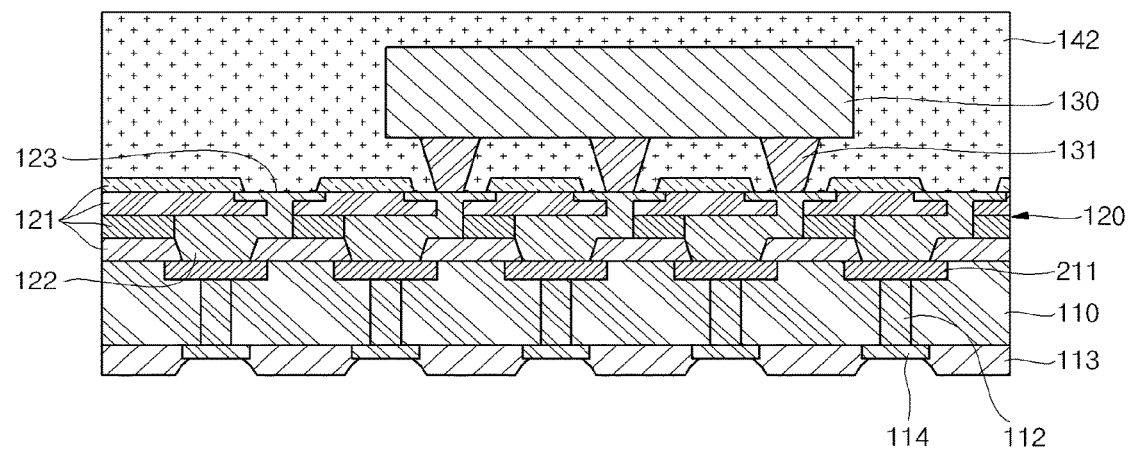
Figure 4G:
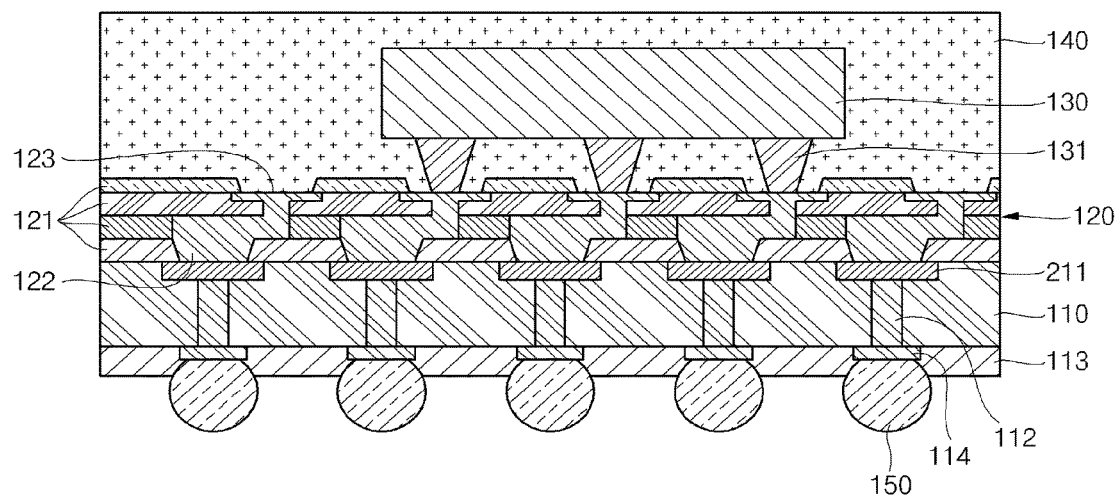

FIG. 3 is a diagram illustrating an example configuration of a semiconductor device (200) using an EMC wafer support system according to various aspects of the present disclosure, and FIGS. 4a to 4g are diagrams sequentially illustrating an example fabricating method of a semiconductor device, for example the semiconductor device 200, using the EMC wafer support system shown in FIG. 3.

In the semiconductor device 200 using the EMC wafer support system shown in FIG. 3, a bond pad 211 is formed on a top surface of a TSV 112. Therefore, a redistribution layer 122 of an interposer 120 is electrically connected to the bond pad 211.

In the following description, an explanation of the same portion as that in the semiconductor device 100 using the EMC wafer support system shown in FIG. 1 will not be given.

The fabricating method of the semiconductor device 200 using the EMC wafer support system shown in FIG. 3 comprises: forming a first encapsulation unit; forming an interposer; connecting a second semiconductor die; forming a second encapsulation unit; exposing a TSV; and bonding a solder ball.

In the forming of the first encapsulation unit, a first encapsulation unit 141 may, for example, be formed on a bottom surface a first semiconductor die 110 including the bond pad 211 and the TSV 112, thereby protecting the first semiconductor die 110 from external surroundings and facilitating handling of the first semiconductor die 110. See, e.g., FIG. 4a.

In the forming of the interposer, the interposer 120 having the redistribution layer 122 connected to the TSV 112 may, for example, be formed on a top surface of the first semiconductor die 110, thereby electrically connecting the first semiconductor die 110 and the second semiconductor die 130 stacked on the top surface of the first semiconductor die 110. See, e.g., FIG. 4b.

In the connecting of the second semiconductor die, the second semiconductor die 130 may, for example, be connected to the redistribution layer 122 of the interposer 120, thereby electrically connecting the second semiconductor die 130 to the redistribution layer 122 of the interposer 120 through a bump 131. See, e.g., FIG. 4c.

In the forming of the second encapsulation unit, the second semiconductor die 130 may, for example, be encapsulated by a second encapsulation unit 142. The second encapsulation unit 142 may, for example, have a thickness greater than that of the first encapsulation unit 141. The second encapsulation unit 142 can facilitate handling of the first semiconductor die 110 and the second semiconductor die 130 and can protect the first semiconductor die 110 and the second semiconductor die 130 from external surroundings, for example in polishing the first encapsulation unit 141 by CMP or performing other processing. See, e.g., FIG. 4d.

In the exposing of the TSV, the first encapsulation unit 141 may, for example, be polished by CMP using the second encapsulation unit 142, for example as support, thereby exposing the TSV 112. A redistribution layer 114 and a passivation layer 113 may be formed on the exposed TSV 112. The redistribution layer 114 may, for example, be surrounded (e.g., laterally surrounded and/or at least partially vertically surrounded) by the passivation layer 113. See, e.g., FIG. 4e.

In the bonding of the solder ball, a solder ball 150 may, for example, be bonded to the redistribution layer 114. The passivation layer 113 may, for example, be formed on the bottom surface of the first semiconductor die 110 toward the outside of (e.g., laterally around) the solder ball 150. See, e.g., FIGS. 4f and 4g. Note that the solder ball 150 may also be another interconnection structure, for example a conductive bump, copper pillar, etc.

In the fabricating method of the semiconductor device 200 using the EMC wafer support system according to various aspects of the present disclosure, forming of interposer, connecting of semiconductor die, and molding may be concurrently performed through batch processing, rather than using a wafer support system made of silicon or glass, which is costly, thereby shortening the fabricating process and remarkably reducing the fabrication cost.

This disclosure provides example embodiments supporting various aspects of the present invention. The scope of various aspects of the present invention is not necessarily limited by these exemplary embodiments. Numerous variations, whether explicitly provided for by the specification or implied by the specification, such as variations in structure, dimension, type of material and manufacturing process, may be implemented by one skilled in the art in view of this disclosure without departing from the spirit and scope of the present disclosure, for example as set forth in the following claims.

What is claimed is:

1. A method of manufacturing a semiconductor device comprising a lower semiconductor die and an upper semiconductor die electrically coupled to the lower semiconductor die, the method comprising:
   forming a wafer support structure, wherein the wafer support structure comprises a top surface that is coupled to a bottom surface of the lower semiconductor die;
   after said forming the support structure, electrically coupling the upper semiconductor die to the lower semiconductor die;
   after said coupling the upper semiconductor die to the lower semiconductor die and prior to singulating the lower semiconductor die from a semiconductor wafer, forming an encapsulation layer above the upper semiconductor die, above the lower semiconductor die, and laterally surrounding the upper semiconductor die;
   after said forming the encapsulation layer above the upper semiconductor die, removing the entire support structure; and
   forming an interposer by, at least in part, sequentially layering a plurality of dielectric layers and a plurality of conductive layers on the lower semiconductor die, wherein:
      the plurality of conductive layers comprises a first conductive layer, and a second conductive layer
      the plurality of dielectric layers comprises a first dielectric layer, a second dielectric layer, and a third dielectric layer;
      the first dielectric layer and the second dielectric layer laterally surround the first conductive layer;
      the second conductive layer comprises a land for coupling to the second semiconductor die;
      the third dielectric layer laterally surrounds the land and covers at least a portion of a bottom side of the land; and
      said electrically coupling the upper semiconductor die to the lower semiconductor die comprises electrically coupling the upper semiconductor die to the interposer.

2. The method of claim 1, comprising
   forming at least one intervening layer between the lower semiconductor die and the support structure; and
   removing the at least one intervening layer after said removing the entire support structure.

3. The method of claim 2, wherein the at least one intervening layer comprises a metal layer.

4. The method of claim 1, wherein the wafer support structure comprises a molded structure.

5. The method of claim 1, wherein a lateral surface of the lower semiconductor die, a lateral surface of the interposer, and a lateral surface of the encapsulation layer are coplanar.

6. The method of claim 1, wherein when the semiconductor device is completed, a top side of the upper semiconductor die is entirely covered by the encapsulation layer.

7. The method of claim 1, comprising after said removing the entire support structure, forming a package interconnection structure below the lower semiconductor die, wherein said forming a package interconnection structure comprises:
   sequentially layering at least one lower-side conductive layer and at least one lower-side dielectric layer on a lower side of the lower semiconductor die; and
   forming a conductive ball on the at least one lower-side conductive layer,
   wherein the at least one lower-side dielectric layer laterally surrounds a portion of the conductive ball.

8. The method of claim 1, wherein said coupling the upper semiconductor die to the lower semiconductor die comprises coupling the upper semiconductor die to the lower semiconductor die when the lower semiconductor die has a thickness greater than 400 microns and comprises a through silicon via (TSV) having a length no greater than 70 microns.

9. A method of manufacturing a semiconductor device, the method comprising:
   forming a structure comprising:
      a first semiconductor die comprising: a bond pad on a top side of the first semiconductor die, and a through silicon via (TSV) extending from the bond pad toward a bottom side of the first semiconductor die; and a support structure, wherein the support structure comprises a top side coupled to the bottom side of the first semiconductor die;

forming an interposer on the top side of the first semiconductor die, said forming an interposer comprising sequentially layering at least one conductive layer and at least one dielectric layer on the top side of the first semiconductor die, wherein the at least one conductive layer is electrically connected to the bond pad;

connecting a second semiconductor die to the at least one conductive layer of the interposer;

forming an encapsulation layer around the second semiconductor die;

exposing the TSV, said exposing the TSV comprising removing the support structure; and forming a lower interconnection structure on the exposed TSV.

10. The method of claim 9, wherein said forming a lower interconnection structure on the exposed TSV comprises:

sequentially layering at least one lower-side conductive layer and at least one lower-side dielectric layer on the bottom side of the first semiconductor die, where the at least one lower-side conductive layer is electrically coupled to the exposed TSV; and forming a conductive ball on the at least one lower-side conductive layer.

11. The method of claim 10, wherein the at least one lower-side dielectric layer laterally surrounds a portion of the conductive ball.

12. The method of claim 9, wherein when the semiconductor device is completed, a top side of the second semiconductor die is entirely covered by the encapsulation layer.

13. The method of claim 9, wherein said exposing the TSV comprises, after said removing the support structure, removing material from the bottom side of the first semiconductor die.

14. The method of claim 9, wherein a lateral surface of the first semiconductor die, a lateral surface of the interposer, and a lateral surface of the encapsulation layer are coplanar.

15. The method of claim 9, wherein said forming the interposer comprises forming the interposer when the first semiconductor die has a thickness greater than 400 microns and when the TSV has a length no greater than 70 microns.

16. A semiconductor device comprising:

a first semiconductor die comprising: a bond pad on a top side of the first semiconductor die, and a through silicon via (TSV) extending from the bond pad completely to a bottom side of the first semiconductor die;

an interposer on the top side of the first semiconductor die, the interposer comprising at least one conductive layer and at least one dielectric layer, wherein the at least one conductive layer is electrically connected to the bond pad;

a second semiconductor die coupled to the interposer and electrically connected to the at least one conductive layer of the interposer;

an encapsulation layer around the second semiconductor die and on the top side of the first semiconductor die, wherein a top side of the second semiconductor die is entirely covered by the encapsulation layer; and a lower interconnection structure on the TSV at the bottom side of the first semiconductor die, wherein:

the at least one conductive layer of the interposer comprises a first conductive layer, and a second conductive layer;

the at least one dielectric layer of the interposer comprises a first dielectric layer, a second dielectric layer, and a third dielectric layer;

the first dielectric layer and the second dielectric layer laterally surround the first conductive layer;

the second conductive layer comprises a land for coupling to the second semiconductor die; and the third dielectric layer laterally surrounds the land and covers at least a portion of a bottom side of the land.

17. The semiconductor device of claim 16, wherein the encapsulation layer laterally surrounds the second semiconductor die, and the encapsulation layer does not laterally surround the first semiconductor die.

18. The semiconductor device of claim 16, wherein the encapsulation layer underfills between the second semiconductor die and the interposer, but does not underfill between the first semiconductor die and the interposer.

19. The semiconductor device of claim 16, wherein a lateral side of the first semiconductor die, a lateral side of the interposer, and a lateral side of the encapsulation layer are coplanar.

20. The semiconductor device of claim 16, wherein the lower interconnection structure comprises:

a signal distribution structure comprising a lower conductive layer and a lower dielectric layer sequentially layered on the bottom side of the first semiconductor die, where the lower conductive layer is electrically coupled to the TSV; and a conductive ball coupled to the lower conductive layer, wherein a portion of the conductive ball is laterally surrounded by the lower dielectric layer.

* * * * *